United States Patent [19]
Griffiths et al.

[11] Patent Number: 5,374,899
[45] Date of Patent: Dec. 20, 1994

[54] SELF BIASED POWER AMPLIFIER EMPLOYING FETS

[75] Inventors: James R. Griffiths; Inder J. Bahl, both of Roanoke, Va.

[73] Assignee: ITT Corporation, New York, N.Y.

[21] Appl. No.: 150,424

[22] Filed: Nov. 10, 1993

[51] Int. Cl.⁵ .............................................. H03F 3/16
[52] U.S. Cl. ...................................... 330/277; 330/296
[58] Field of Search ............... 330/277, 296, 287, 283

[56] References Cited

U.S. PATENT DOCUMENTS 4,275,362  6/1981  Harford .............................. 330/283

OTHER PUBLICATIONS

Gannaway et al., A Gasfet preamplifier for 432MHz with 0.5dB noise figure, Dec. 1980, pp. 1270–1275.
*Gallium Arsenide Integrated Circuits Design and Technology*, edited by Joseph Munn, published by McMillian publishing Company (1988); chapter 4, entitled "Monolithic Microwave Integrated Circuit Design or MMIC Design", pp. 249–262.

*Primary Examiner*—James B. Mullins
*Assistant Examiner*—James Dudek
*Attorney, Agent, or Firm*—Arthur L. Plevy; Patrick M. Hogan

[57] ABSTRACT

A power amplifier for microwave frequencies utilizes a FET device operating from a common voltage source. The voltage source has the positive terminal coupled to the drain electrode of the FET. The gate electrode of the FET is adapted to receive a RF signal while the source electrode of the FET includes a voltage limiting diode that is in parallel across the source impedance. In operation the extra current required from the voltage source during power amplification is passed through the diode and the FET source bypass capacitor. This results in the FET source voltage remaining relatively constant to enable improved power and gain operation.

18 Claims, 1 Drawing Sheet

SELF BIASED POWER AMPLIFIER EMPLOYING FETS

FIELD OF THE INVENTION

This invention relates to power amplifiers and more particularly to power amplifiers which are used at high frequencies such as in the microwave range.

BACKGROUND OF INVENTION

Field effect transistor (FET) power amplifiers can operate in either class AB, class B, or class C and so on. These amplifiers normally require two voltage sources for proper biasing. The drain voltage of the FET is always positive and requires three to twelve volts DC. The gate voltage requires a negative voltage of about 0.5 to 4 volts DC. In any event conventional self biased amplifiers utilizing a single voltage source have been used in low noise and class A applications. The conventional self biased amplifier is not capable of producing appreciable RF power due to the negative feedback effect in the bias caused by the applied RF power. This is of a particular concern for microwave operation or operation for frequencies in the range between 1 GHZ to 2 GHZ or more. As one can ascertain microwave FETs such as gallium arsenide (GaAs) devices are capable of extremely high frequency operation and are relatively low noise devices because only the majority carriers participate in the operation of such devices.

For example, devices as GaAs MESFETs and other such devices have been widely employed in the microwave frequency band. A microwave amplifier usually consists of a cascade of several active devices with interstage and input/output matching networks. The design and operation of such amplifiers in the various classes as indicated above is well known. However, the design of the bias circuits for monolithic ICs (MMICs) amplifiers in microwave technology is as important as the design of the matching networks. A good RF design becomes useless if the amplifier oscillates due to an improper bias network design. The bias circuit determines the device operating point, (power or low noise), amplifier stability particularly at lower microwave frequencies, temperature stability and often gain. Depending on the application for low noise, high gain, and class operation (A, AB, or B) and for efficiency an optimum DC operating bias point exists. Various networks for biasing FET amplifiers are well known and as indicated above normally require at least two sources namely a positive drain source and a negative gate source or alternatively a positive drain source and a positive source electrode voltage. Examples of typical FET biasing circuits for microwave frequencies can be had by reference to a text entitled *GaAs Integrated Circuits- Design and Technology* edited by Joseph Mum published by McMillan Publishing Company (1988), chapter 4 entitled "Monolithic Microwave Integrated Circuit Design or MMIC Design". Page 251, Figure 4.37 depicts various FET biasing circuits. In any event, as one will understand power amplifier design is considerably more complex than small signal linear amplifier design due to many factors.

In contrast to small signal amplifier design, power amplifiers are generally designed to provide maximum power to a load at high efficiency. The bias point of the device has a major impact on the device output power and efficiency. While class A operation produces the highest power, class AB or more accurately, class B usually results in the highest efficiency.

In any event, conventional self biased amplifiers utilizing a single voltage source when used in low noise and class A applications are not capable of producing RF power as indicated above due the negative feedback effect in the bias caused by the applied RF power.

The dual bias designs (two voltage supplies) require a power up and down sequence whereby the gate bias is first applied for power up and the drain bias must first be removed for power down. This sequence must be followed to prevent degradation of the device or actual destruction of the device due to the resultant high drain currents. Thus the scheme which is utilized for dual bias devices requires extra bias circuitry to assure such synchronization.

It is therefore an object of the present invention to provide a power amplifier utilizing a single bias voltage source which exhibits improved power gain and power operation.

SUMMARY OF INVENTION

An RF power amplifier, comprising a field effect transistor (FET) having a gate, drain, and source electrode, with said gate electrode adapted to receive an input RF signal with said drain electrode adapted to receive a source of DC potential, a unilateral current conducting device having a first and second terminal, with the first terminal of said device coupled to said FET source electrode and with the second terminal of said device coupled to a point of reference potential, a capacitor shunting said unilateral current conducting device and impedance means shunting said capacitor and operative to provide a bias voltage at said source electrode according to the drain current flowing through said FET, whereby as said input RF signal increases the current through said unilateral current conducting device increases in a direction to maintain the gain and therefore the power output of said amplifier constant.

DETAILED DESCRIPTION OF THE FIGURES

Figure 1:
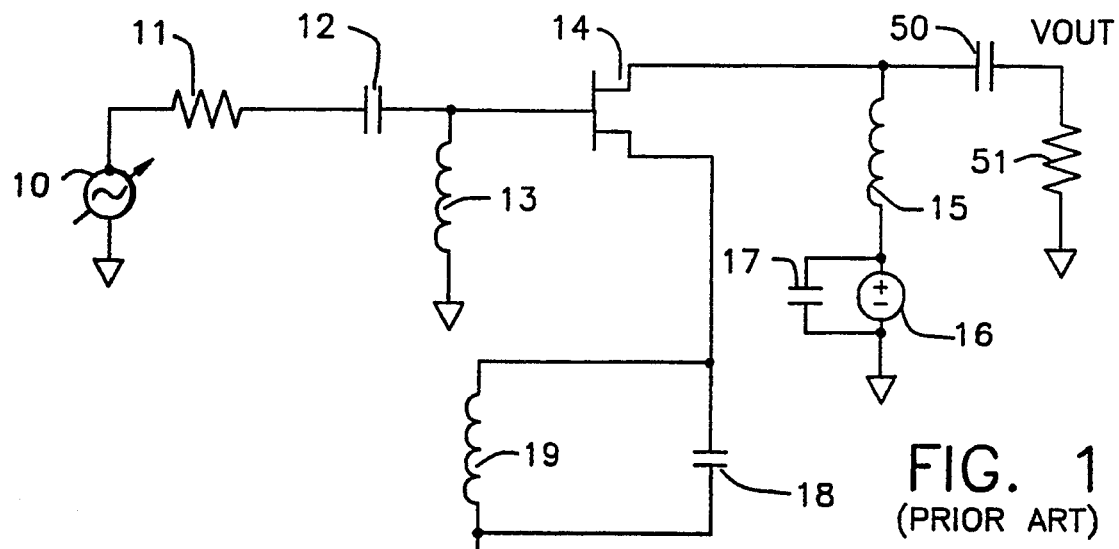
FIG. 1 is a schematic diagram showing a conventional self biased amplifier according to the prior art.

Referring to FIG. 1 there is shown a prior art conventional self biased amplifier. The amplifier in FIG. 1 utilizes a microwave FET device 14 having the drain electrode coupled through an inductor 15 to the positive terminal of a single bias or voltage source 16. The negative terminal of the bias source 16 is coupled to a point of reference potential such as ground. The voltage source 16 is conventionally shunted by a bypass capacitor 17. The source electrode of the FET 14 is coupled to the shunt combination of a bias resistor 19 in shunt with a bypass capacitor 18. The other terminal of the shunt combination is directed to the point of reference potential. A microwave or RF signal developed by a source or generator 10 is applied to the FET gate electrode via an impedance circuit consisting of resistor 11 in series with capacitor 12. The gate electrode is further coupled to the point of reference potential via a shunt inductor 13. The operating frequency of the amplifier may be in the vicinity of between 1 to 18 GHZ and typically a frequency of 1.885 GHZ may be employed.

As one can see from FIG. 1, a bias voltage for the FET 14 is developed across resistor 19 to thereby produce a quiescent operating voltage for the FET 14. The voltage across resistor 19 is a direct function of the drain current which current is supplied by the single voltage source 16. As one will understand for class A operation it is desired that the FET be biased in the center of its linear characteristic so that the positive and negative voltage swings due to the input RF signal at the gate electrode are relatively the same. This is typical class A operation. See the aforementioned text page 257, paragraph 4-4-1.1, entitled "Class A Operation". In the amplifier configuration shown in FIG. 1 as the applied RF power increases at the gate electrode from generator 10 there is a resulting increase in drain current. In this manner the voltage across resistor 19 in series with the source electrode increases which results in a reduction in gain and power. Capacitor 18 is employed to attempt to bypass the resistor 19 for RF operation. In any event the voltage at the source electrode will increase due to the increased drain current and because of this there is a reduction in power.

Figure 2:
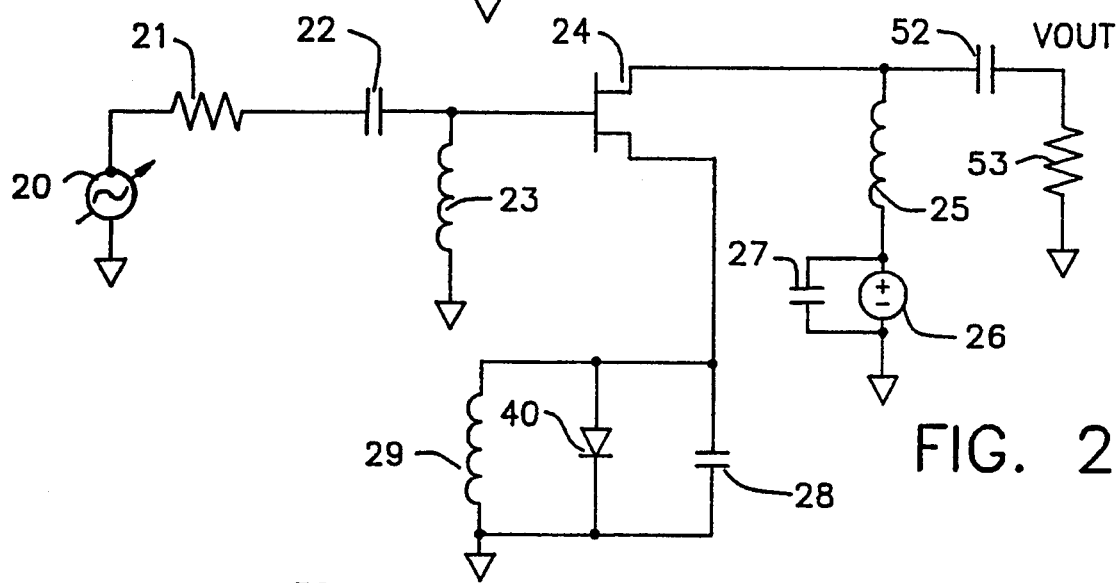
FIG. 2 is a schematic diagram showing a self biased power amplifier according to this invention.
Figure 3:
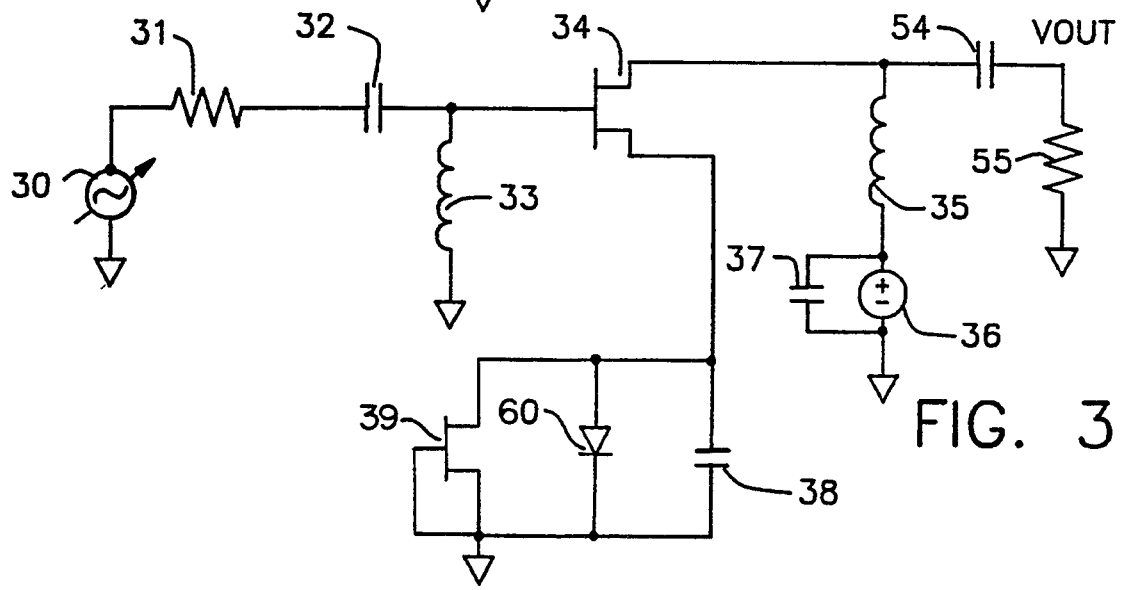
FIG. 3 is a schematic diagram showing a self biased power amplifier utilizing a constant current source according to this invention.

Referring to FIGS. 2 and 3 schematic diagrams for amplifiers according to this invention are shown. Essentially, as one will ascertain from FIGS. 2 and 3, similar components have been indicated by associated reference numerals. For example the generator 10 of FIG. 1 is referenced to as 20 in FIG. 2 and 30 FIG. 3, resistor 11 of FIG. 1 is referenced to as resistor 21 in FIG. 2 and resistor 31 in FIG. 3 and so on. It is further indicated that the output signal (volt) of FIG. 1 is provided between the junction by capacitor 50 and resistor 51.

As shown in FIG. 2 the source electrode of FET 24 is now directed to the point of reference potential via resistor 29 which is shunted by a diode 40 and capacitor 28. As can be seen the diode 40 has its anode electrode coupled to the FET source electrode with the cathode electrode coupled to the point of reference potential. It is understood that the diode 40 can be implemented by utilization of a FET device having the gate electrode coupled to the drain electrode or to the source electrode. In any event, as one can understand a single biasing source 26 is again employed which biasing source enables FET 24 to produce a drain current. A FET source voltage is developed due to resistor 29 which voltage provides the bias for the amplifier. As seen again in FIG. 2 the amplifier requires one voltage source namely source 26 and includes the voltage limiting diode 40 that is in parallel across resistor 29.

The diode 40 which appears across the source impedance (resistor 29 and capacitor 28) operates to provide a voltage drop which voltage drop is limited by the turn on voltage of the diode. The extra current required from the voltage source during power amplification is directed through the diode and the source bypass capacitor 28. This results in the source voltage remaining constant. Thus for increasing RF signals from generator 20 and applied to the drain electrode of the FET 24, the voltage across the FET source electrode does not increase as does the voltage in the prior art, but is limited by the current flowing through the diode 40. In this manner the gain and power operation of the amplifier is held relatively constant as compared to the prior art devices. While a single diode 40 is shown it is obvious that such diodes can be placed in series and in shunt with the resistor 29 and capacitor 28. The series connection of diodes as for example 1, 2 or more enables one to change the voltage drop which voltage drop would now be limited by the turn on voltage of the series diodes. Thus the voltage drop would be a function of the number of diodes in series.

In regard to the circuit configuration of FIG. 3 there is shown a diode 60 which operates as diode 40. In any event, the resistor 29 of FIG. 2 has been replaced by a FET 39 having the gate electrode connected to the FET source electrode. The FET 39 operates as a diode and functions as a constant current source in conjunction with diode 60. In this manner the voltage drop is again limited by the turn on voltage of the diode 60. The extra current required from the voltage source during power amplification passes through the diode 60 as well as through the FET 39 and the bypass capacitor 38. This results in the source voltage of FET 34 remaining relatively constant. The output (Vout) is derived at the junction between capacitor 54 and resistor 55. Thus the circuits shown in FIGS. 2 and 3 both require one voltage source and include voltage limiting circuitry which operates in parallel across the FET source impedance to provide relatively constant gain and power operation.

Components utilized in these amplifiers are as follows. It is understood that these component values are given only by way of example and different values could be employed. A typical frequency of operation which would be provided by frequency sources 10, 20, and 30 is 1.885 GHZ. Resistors 11, 21, and 31 are 50 ohms, Capacitors 12, 22, and 32 are 100 picofarads, Inductors 13, 23, and 33 are 30 nanohenrys. The field effect transistors are gallium arsenide (GaAs) devices for typical microwave operation, Capacitors 18, 28, and 38 are 200 picofarads, with resistors 19 and 29 being 20 ohms. Inductors 15, 25, and 35 are 25 nanohenrys, with capacitors 17, 27, and 37 being 68 picofarads. Capacitors 50, 52, and 54 are typically 100 picofarads with resistors 51, 53, and 55 being 50 ohms. The voltage sources 16, 26, and 36 typically operate at 3 volts DC. This voltage of 3 volts is used in operation by typical cellular systems which operate in the range of 1 to 2 GHZ. The 3 volts is supplied by conventional batteries. In any event, the voltage can be between three to 12 volts as supplied by conventional batteries. The FET devices 14, 24, and 34 are typically 1200 micron devices. As one can ascertain, the amplifier operation at a voltage of 3 volts complicate the biasing problem of the FET power amplifier for class AB or B operation from a single power supply. This problem is even more difficult because of the low operating voltage.

In any event, the above described circuits operate to avoid excessive power loss and avoid an increase in intermodulation products to enable the amplifiers of FIG. 2 and 3 to operate at class A operation producing relatively symmetrical positive and negative swings thereby producing relatively linear voltage outputs. Based on circuit tests, the source diode operation improved the gain from 6.5 db to 18 db with a substantial improvement in power output. Other alternatives are encompassed within the spirit and scope of this invention as defined by the claims therein.

We claim:

1. A RF power amplifier, having a given gain and a given power output comprising:
    a field effect transistor (FET) having a gate, drain, and source electrode, with said gate electrode adapted to receive an input RF signal and with said drain electrode adapted to receive a source of DC potential;

first inductor means having a first terminal coupled to said FET drain electrode and a second terminal for coupling to said source of D.C. potential;

a unilateral current conducting device having a first and second terminal, with the first terminal of said device coupled to said source electrode and with the second terminal of said device coupled to a point of reference potential; and a capacitor shunting said unilateral current conducting device and impedance means shunting said capacitor and operative to provide a bias voltage at said FET source electrode of a value according to the drain current flowing through said FET, whereby as said input RF signal increases the current through said unilateral current conducting device increases in a direction to maintain the FET source voltage relatively constant wherein the gain remains relatively constant and therefore said power output of said amplifier increases.

2. The amplifier according to claim 1 wherein said impedance means is a resistor.

3. The amplifier according to claim 1 wherein said impedance means is selected to produce a voltage for operating said amplifier in class B operation.

4. The amplifier according to claim 1 wherein said impedance means is selected to produce a voltage for operating said amplifier in class AB operation.

5. The amplifier according to claim 1 wherein said FET is a gallium arsenide (GaAs) FET.

6. The amplifier according to claim 1 wherein said unilateral current conducting device is at least a single diode having an anode and cathode terminal with said anode terminal connected to said FET source electrode and said cathode terminal connected to a point of reference potential.

7. The amplifier according to claim 1 wherein said source of DC potential is a positive source of potential of a magnitude of about three to twelve volts DC.

8. The amplifier according to claim 1 wherein said input RF signal has a frequency between 1 to 18 GHZ.

9. The amplifier according to claim 1 further including second inductor means having a first terminal coupled to said FET gate electrode and a second terminal coupled to a point of reference potential.

10. In a RF power amplifier for class B or AB operation, having a given gain and a given power output including an FET having a drain, source, and a gate electrode, with the drain electrode adapted to receive a positive DC bias voltage, with a first inductor means having a first terminal coupled to said FET drain electrode and a second terminal for coupling to said source of DC potential, with said gate electrode adapted to receive a RF input signal of varying amplitude and of a frequency of at least 1 GHZ or greater, with said FET source electrode directed to a point of reference potential through an impedance to provide a DC voltage at the source electrode according to the drain current flow through said FET whereby said source voltage undesirably varies according to said applied input RF signal as increasing said drain current, the improvement in combination therewith, comprising;

diode means shunting said impedance means and operative to shunt drain current from said impedance means to maintain said source voltage relatively constant for increasing drain current flow with increasing RF input signal strength whereby said gain remains relatively constant as a function of RF input signal strength and therefore said power output of said amplifier increases.

11. The RF power amplifier according to claim 10 wherein said diode means further includes a capacitor shunting said impedance means.

12. The RF amplifier according to claim 10 wherein said impedance means is a resistor.

13. The RF power amplifier according to claim 10 wherein said diode means includes a FET device having a source, drain and gate electrode, with the drain electrode coupled to the anode terminal of a diode with the gate and source electrodes connected together and to the cathode terminal of said diode and to a point of reference potential, with said FET device and diode operative to provide a constant source current for said FET source electrode.

14. The RF power amplifier according to claim 10 wherein said DC source is relatively 3 to 12 volts in magnitude.

15. The RF power amplifier according to claim 10 further including a second inductor means having a first terminal coupled to the gate electrode of said FET and a second terminal coupled to a point reference potential.

16. The RF power amplifier according to claim 10 further including a capacitor and resistor connected in series between said gate electrode of said FET and said RF input signal.

17. The RF power amplifier according to claim 10 wherein said FET is a GaAs FET.

18. A RF power amplifier having a given gain and a given power output comprising:
a first field effect transistor (FET) having a gate, drain, and source electrode, with said gate electrode adapted to receive an input RF signal and with said drain electrode adapted to receive a source of DC potential;

a unilateral current conducting device having a first and second terminal, with the first terminal of said device coupled to said source electrode and with the second terminal of said device coupled to a point of reference potential; and a capacitor shunting said unilateral current conducting device and a second field effect transistor shunting said capacitor and operative to provide a bias voltage at said first FET source electrode of a value according to the drain current flowing through said first FET, said second FET having a drain electrode, a source electrode and a gate electrode, wherein said drain electrode of said second FET is coupled to said source electrode of said first FET and said gate electrode of said second FET is connected to said source electrode of said second FET;

whereby as said input RF signal increases the current through said unilateral current conducting device increases in a direction to maintain the first FET source voltage relatively constant wherein the gain remains relatively constant and therefore said power output of said amplifier increases.

\* \* \* \* \*